United States Patent
Sandupatla et al.

(10) Patent No.: US 12,199,177 B1
(45) Date of Patent: Jan. 14, 2025

(54) HIGH-ELECTRON-MOBILITY TRANSISTORS WITH INACTIVE GATE BLOCKS

(71) Applicant: GlobalFoundries U.S. Inc., Malta, NY (US)

(72) Inventors: Abhinay Sandupatla, Leuven (BE); Bartłomiej Jan Pawlak, Leuven (BE); Christian Witt, Woodbridge, CT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/769,902

(22) Filed: Jul. 11, 2024

(51) Int. Cl.
| | | |
|---|---|---|
| H01L 29/778 | (2006.01) | |
| H01L 29/20 | (2006.01) | |
| H01L 29/423 | (2006.01) | |
| H01L 29/66 | (2006.01) | |

(52) U.S. Cl.
CPC ...... H01L 29/7787 (2013.01); H01L 29/2003 (2013.01); H01L 29/42372 (2013.01); H01L 29/66462 (2013.01)

(58) Field of Classification Search
CPC .......... H01L 29/66462; H01L 29/7787; H01L 29/7786; H01L 29/778; H01L 29/66431
See application file for complete search history.

(56) References Cited

U.S. PATENT DOCUMENTS

| | | | |
|---|---|---|---|
| 2007/0272957 A1* | 11/2007 | Johnson | H01L 29/42316 257/E29.127 |
| 2019/0273140 A1* | 9/2019 | Sasaki | H01L 29/2003 |
| 2020/0006322 A1* | 1/2020 | Then | H01L 27/0255 |
| 2020/0373409 A1* | 11/2020 | Chen | H01L 29/66469 |
| 2021/0013336 A1 | 1/2021 | Jeon et al. | |
| 2022/0102339 A1* | 3/2022 | Then | H01L 25/10 |
| 2022/0406927 A1 | 12/2022 | Park | |
| 2023/0047449 A1* | 2/2023 | Thomas | H01L 21/0254 |

FOREIGN PATENT DOCUMENTS

KR  101683470 B1  12/2016

OTHER PUBLICATIONS

Chi Sun et al., "Reduced Reverse Gate Leakage Current for p-GaN Gate High-Electron-Mobility-Transistors by a Surface-Etching Method." Physica status solidi (a). vol. 218, Issue 8. 10.1002/pssa.202000666 (2021).
S. Abhinay et al., "Comprehensive Investigations of HBM ESD Robustness for GaN-on-Si RF HEMTs," 2022 International Electron Devices Meeting (IEDM), San Francisco, CA, USA, 2022, pp. 30.7.1-30.7.4, doi: 10.1109/IEDM45625.2022.10019357.

* cited by examiner

*Primary Examiner* — Evren Seven
(74) *Attorney, Agent, or Firm* — Thompson Hine LLP; Anthony Canale

(57) ABSTRACT

Structures for a high-electron-mobility transistor and methods of forming such structures. The structure comprises a device structure including a gate and an ohmic contact, and one or more inactive blocks laterally positioned between the gate and the ohmic contact.

20 Claims, 4 Drawing Sheets

HIGH-ELECTRON-MOBILITY TRANSISTORS WITH INACTIVE GATE BLOCKS

STATEMENT REGARDING FEDERALLY SPONSORED RESEARCH OR DEVELOPMENT

This invention was made with government support under HQ0727790700 awarded by the Defense Microelectronics Activity. The government has certain rights in the invention.

BACKGROUND

The disclosure relates to semiconductor device fabrication and integrated circuits and, more specifically, to structures for a high-electron-mobility transistor and methods of forming such structures.

Compound semiconductors are characterized by material properties, such as a carrier mobility that is greater than the carrier mobility of silicon and a wider band gap than silicon, that can be exploited. Compound semiconductors may include, for example, Group III elements (e.g., aluminum, gallium, and/or indium) and Group V elements (e.g., nitrogen, phosphorus, arsenic, and/or antimony) combined with the Group III elements.

High-electron-mobility transistors are compound semiconductor-based devices that may be deployed in certain integrated circuit applications, such as high-voltage power electronics. A high-electron-mobility transistor may include a heterojunction between crystalline compound semiconductor materials having different band gaps, such as a heterojunction between binary gallium nitride and trinary aluminum-gallium nitride. During operation, a two-dimensional electron gas is formed near an interface at the heterojunction and defines the channel of the high-electron-mobility transistor.

A high-electron-mobility transistor has multiple terminals, namely, a gate, a source, and a drain. The gate that is used to control carrier flow between the source and drain. The gate has a tendency to be a source of failures in the ON state, in the OFF state, and when exposed to an electrostatic discharge.

Improved structures for a high-electron-mobility transistor and methods of forming such structures are needed.

SUMMARY

In an embodiment of the invention, a structure comprises a device structure including a gate and an ohmic contact, and one or more inactive blocks laterally positioned between the gate and the ohmic contact.

In an embodiment of the invention, a method comprises forming a device structure including a gate and an ohmic contact, and forming one or more inactive blocks laterally positioned between the gate and the ohmic contact.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
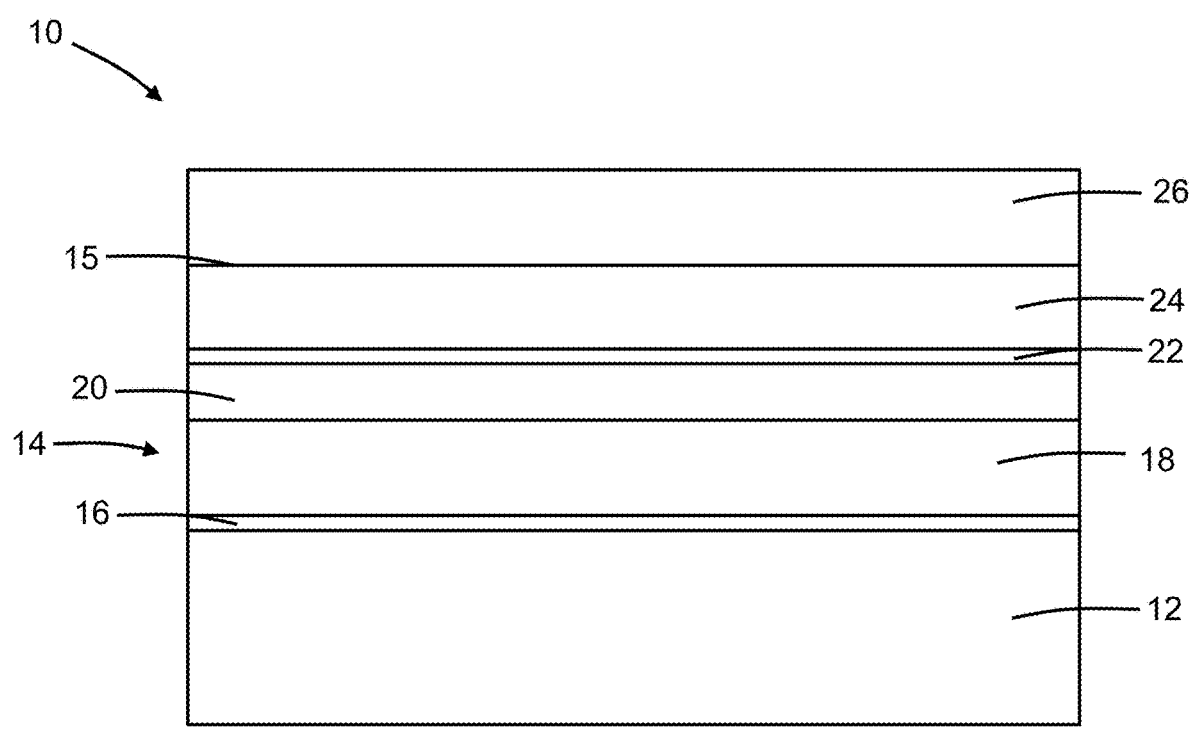
FIG. 1 is a cross-sectional view of a structure at an initial fabrication stage of a processing method in accordance with embodiments of the invention.

With reference to FIG. 1 and in accordance with embodiments of the invention, a structure 10 for a high-electron-mobility transistor may include a layer stack 14 that is formed on the top surface of a substrate 12. The substrate 12 may be comprised of a single-crystal semiconductor material, such as single-crystal silicon. The substrate 12 may be a bulk substrate that contains a single-crystal semiconductor material, such as single-crystal silicon. In an embodiment, the single-crystal semiconductor material of the substrate 12 may have a diamond crystal lattice structure with a <111> crystal orientation as specified by Miller indices. In an embodiment, the substrate 12 may contain single-crystal silicon with a diamond crystal lattice structure having a <111> crystal orientation. For a substrate 12 having a <111> crystal orientation, the (111) crystallographic plane is parallel to the top surface of the substrate 12, and the [111] crystallographic direction is normal to the (111) plane. In an embodiment, the substrate 12 may be fully comprised of semiconductor material with a <111> crystal orientation. The substrate 12 may be doped to have, for example, p-type conductivity. In alternative embodiments, the substrate 12 may be a different type of substrate, such as a sapphire substrate, an engineered substrate, a silicon-on-insulator substrate, a silicon carbide substrate, etc.

The layer stack 14 may include a seed layer 16, a buffer layer 18, a channel layer 20, a barrier layer 22, and a donor layer 24 each containing one or more compound semiconductor materials. The layers 16, 18, 20, 22, 24 may be serially deposited using an epitaxial growth process, such as metalorganic chemical vapor deposition, vapor phase epitaxy, or molecular beam epitaxy, to form the layer stack 14. The layer stack 14 may have a thickness, for example, on the order of five (5) micrometers.

The layers 16, 18, 20, 22, 24 of the layer stack 14 may each have a crystal structure that is single crystal or, alternatively, a crystal structure that is substantially single crystal with varying levels of crystalline defectivity present. The seed layer 16, which provides a thin nucleation layer for the growth of the buffer layer 18, may be comprised of, for example, aluminum nitride. The buffer layer 18 may be comprised of one or more binary or ternary III-V compound semiconductor materials, such as aluminum gallium nitride, gallium nitride, aluminum nitride, or a layered combination of these materials, and the buffer layer 18 is tailored in terms of material composition, doping, layering, and/or layer thickness to accommodate lattice mismatch, thermal property differences, and mechanical property differences between the material of the substrate 12 and the material of the channel layer 20. The channel layer 20, which is disposed on the buffer layer 18, may be comprised of a binary III-V compound semiconductor material, such as gallium nitride. The channel layer 20 may include a sublayer comprised of undoped gallium nitride adjacent to the barrier layer 22 and a sublayer comprised of gallium nitride doped with either carbon or iron adjacent to the buffer layer 18. The barrier layer 22, which is disposed between the channel layer 20 and the donor layer 24, may be comprised of a binary III-V compound semiconductor material, such as aluminum nitride, and the material of the barrier layer 22 may be characterized by a higher electrical resistivity than the material of the channel layer 20 or the material of the donor layer 24. The donor layer 24, which is disposed on the barrier layer 22 and over channel layer 20, may contain a ternary III-V compound semiconductor, such as aluminum gallium nitride. During operation of the high-electron-mobility transistor, a two-dimensional electron gas is formed in the channel layer 20 near the interface with the barrier layer 22.

A gate layer 26 may be formed on the donor layer 24 at the top surface 15 of the layer stack 14. The gate layer 26 may be comprised of a doped III-V compound semiconductor material, such as gallium nitride containing a concentration of a p-type dopant. The gate layer 26 may be deposited using an epitaxial growth process.

Figure 2:
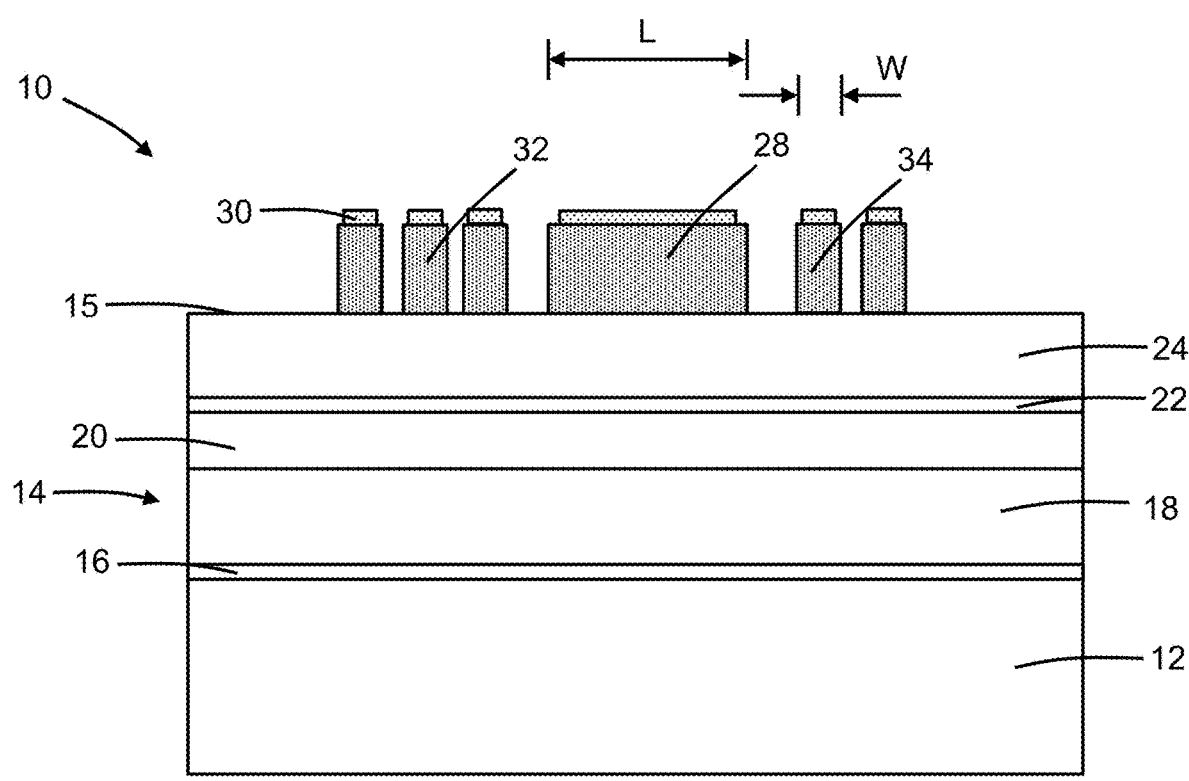
FIG. 2 is a cross-sectional view of the structure at a fabrication stage subsequent to FIG. 1.

With reference to FIG. 2 in which like reference numerals refer to like features in FIG. 1 and at a subsequent fabrication stage, the gate layer 26 may be patterned by lithography and etching processes to define a gate 28 that is positioned on the top surface 15 of the layer stack 14. In an alternative embodiment, the gate 28 may be comprised of one or more metals, and a gate dielectric layer may be positioned between the gate 28 and the top surface 15 of the layer stack 14. In an alternative embodiment, the gate 28 may be positioned in a recess extending into the top surface 15 of the layer stack 14.

Inactive blocks 32 and inactive blocks 34 may be formed adjacent to opposite sides of the gate 28. The gate 28 is laterally positioned between the inactive blocks 32 and the inactive blocks 34. The inactive blocks 32, 34 may be comprised of a doped III-V compound semiconductor material, such as gallium nitride containing a concentration of a p-type dopant. In an embodiment, the inactive blocks 32, 34 may be comprised of the same doped III-V compound semiconductor material as the gate 28. A metal layer 30 comprised of, for example, titanium nitride may be positioned on the top surface of the gate 28 and on the respective top surfaces of the inactive blocks 32, 34.

The inactive blocks 32, 34 may have a width W, and the gate 28 may have a gate length L. In an embodiment, the gate length L of the gate 28 may be greater than the width W of the inactive blocks 32, 34. In an embodiment, the inactive blocks 32, 34 may be bars with respective lengths that may be greater than their widths W or their thicknesses. In an embodiment, the inactive blocks 32, 34 may be fingers that may be joined at one end and that may have respective lengths that are greater than their widths W or their thicknesses.

In an embodiment, the inactive blocks 32, 34 and the gate 28 may be concurrently patterned from the doped III-V compound semiconductor material of the gate layer 26. In an embodiment, the inactive blocks 32, 34 and the gate 28 may have the same dopant concentration. In an alternative embodiment, the inactive blocks 32, 34 may be patterned from a different layer of doped III-V compound semiconductor material than the gate layer 26 used to form the gate 28, which may permit the inactive blocks 32, 34 and the gate 28 may have different dopant concentrations. In an embodiment, the number of inactive blocks 32 may differ from the number of inactive blocks 34 such that the arrangement is asymmetrical about the gate 28. In an alternative embodiment, the number of inactive blocks 32 may be equal to the number of inactive blocks 34 such that the arrangement is symmetrical about the gate 28.

Figure 3:
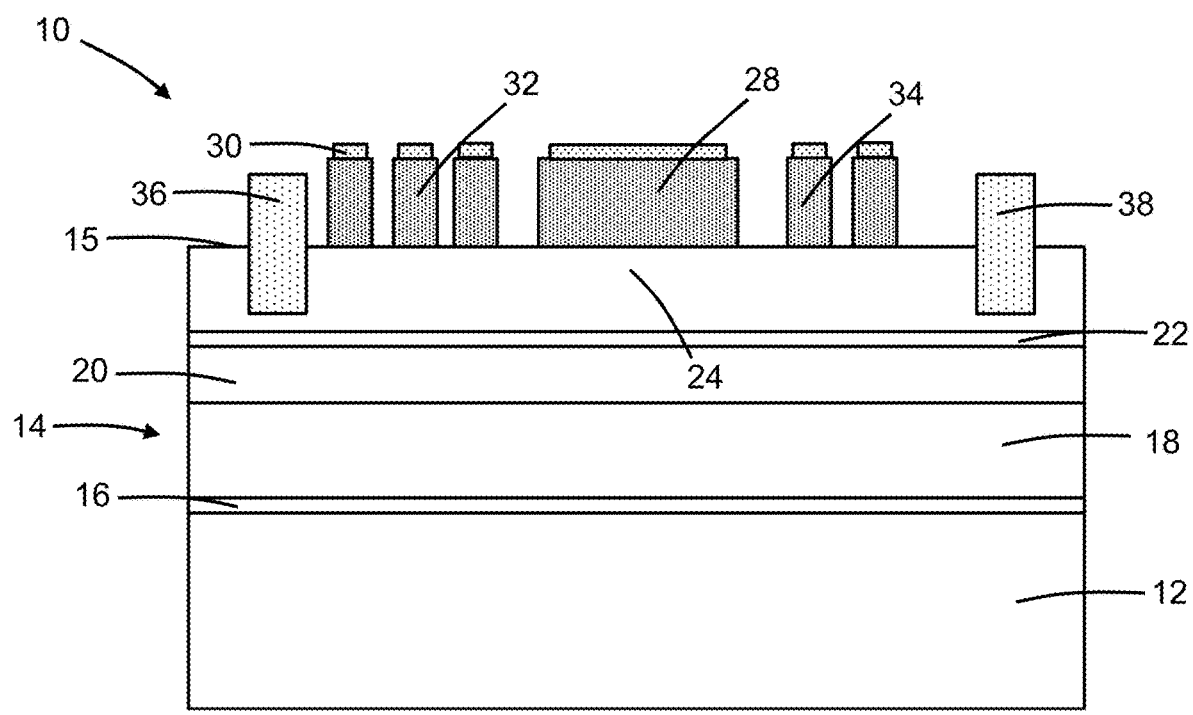
FIG. 3 is a cross-sectional view of the structure at a fabrication stage subsequent to FIG. 2.

With reference to FIG. 3 in which like reference numerals refer to like features in FIG. 2 and at a subsequent fabrication stage, the structure 10 may further include a source ohmic contact 36 and a drain ohmic contact 38 that are disposed on different portions of the layer stack 14. The gate 28 and inactive blocks 32, 34 are positioned in a lateral direction between the source ohmic contact 36 and the drain ohmic contact 38. In an embodiment, the source ohmic contact 36 and the drain ohmic contact 38 may be formed in respective recesses that penetrate partially through the donor layer 24. The source ohmic contact 36 and the drain ohmic contact 38 may contain polycrystalline grains that are comprised of aluminum, titanium, and silicon and polycrystalline grains that are comprised of aluminum. In an embodiment, the source ohmic contact 36 and the drain ohmic contact 38 may be formed by depositing a layer stack including layers of aluminum, titanium, and silicon, and performing a rapid thermal anneal to induce the formation of the polycrystalline grains.

In an embodiment, the source ohmic contact 36 and the drain ohmic contact 38 may represent respective terminals of the high-electron-mobility transistor. In an embodiment, the source ohmic contact 36 may represent a source terminal of the high-electron-mobility transistor and the drain ohmic contact 38 may represent a drain terminal of the high-electron-mobility transistor. The inactive blocks 32 are laterally positioned between the source terminal represented by the source ohmic contact 36 and the gate 28. The inactive blocks 34 are laterally positioned between the drain terminal represented by the drain ohmic contact 38 and the gate 28. The inactive blocks 32, 34 are considered inactive because they do not represent terminals of the high-electron-mobility transistor. More specifically, the inactive blocks 32, 34 are considered inactive because they do not represent the source terminal, the drain terminal, or the gate of the high-electron-mobility transistor.

Figure 4:
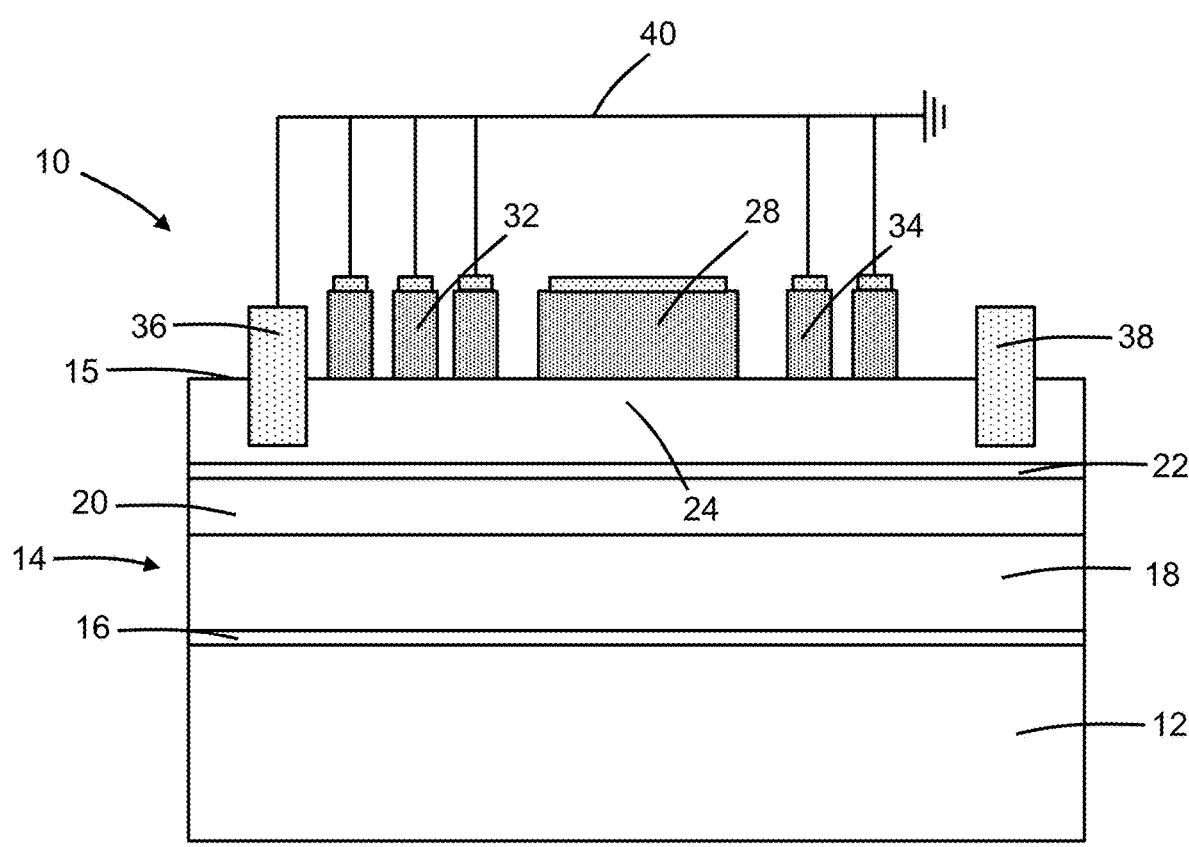
FIG. 4 is a cross-sectional view of the structure at a fabrication stage subsequent to FIG. 3.

With reference to FIG. 4 in which like reference numerals refer to like features in FIG. 3 and at a subsequent fabrication stage, middle-of-line processing and back-end-of-line processing follow, which includes formation of field plates, contacts, vias, and wiring for an interconnect structure coupled to the gate 28, the source ohmic contact 36, and the drain ohmic contact 38 of the high-electron-mobility transistor. In an embodiment, the inactive blocks 32, 34 may be physically and electrically coupled to a field plate 40, as diagrammatically shown in FIG. 4, and the field plate 40 may be coupled to ground. The field plate 40 may also be coupled to the source terminal represented by the source ohmic contact 36 such that the inactive blocks 32, 34 and the source ohmic contact 36 are grounded. In an alternative embodiment, the inactive blocks 32, 34 may be physically and electrically coupled through a different connection in the back-end-of-line stack to ground. The gate 28 and the drain ohmic contact 38 may be electrically and physically isolated from the inactive blocks 32, 34.

The inactive blocks 32 may increase the Gate-Source resistance and the inactive blocks 34 may increase the Gate-Drain resistance, which separately or in combination may be effective to lower gate leakage. The increase in the Gate-Source resistance and/or the increase in the Gate-Drain resistance resulting from presence of the inactive blocks 32, 34 may reduce current flow in the donor layer 24 but not increase the resistance for the two-dimensional electron gas and the source/drain current. The widths W of the inactive blocks 32, 34 are selected such that the thickness of the associated depletion width is confined within the donor layer 24 and does not penetrate into, or through, the barrier layer 22 or into the channel layer 20. The gate 28 may be more robust and may exhibit an improved reliability, both in regular operation and when exposed to an electrostatic discharge event, because of the increased resistance in the donor layer 24 that restricts the gate current.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a device structure including a gate and a first ohmic contact; and
    one or more first inactive blocks laterally positioned between the gate and the first ohmic contact,
    wherein the one or more first inactive blocks comprise gallium nitride with a first concentration of p-type dopant, and the gate comprises gallium nitride with a second concentration of p-type dopant different from the first concentration of p-type dopant.

2. The structure of claim 1 further comprising:
    a substrate; and
    a layer stack on the substrate, the layer stack including a plurality of semiconductor layers each comprising a compound semiconductor material,
    wherein the one or more first inactive blocks are positioned on the layer stack.

3. The structure of claim 2 wherein the gate is positioned on the layer stack.

4. The structure of claim 2 wherein the first ohmic contact is coupled to the layer stack.

5. The structure of claim 2 wherein the device structure includes a second ohmic contact, the gate is laterally positioned between the first ohmic contact and the second ohmic contact, and further comprising:
    one or more second inactive blocks positioned between the gate and the second ohmic contact.

6. The structure of claim 5 wherein the first ohmic contact is coupled to a first portion of the layer stack, and the second ohmic contact is coupled to a second portion of the layer stack.

7. The structure of claim 1 wherein the device structure includes a second ohmic contact, the gate is laterally positioned between the first ohmic contact and the second ohmic contact, and further comprising:
    one or more second inactive blocks positioned between the gate and the second ohmic contact.

8. The structure of claim 7 wherein the one or more second inactive blocks comprise p-type gallium nitride.

9. The structure of claim 1 further comprising:
    a metal layer on each of the one or more first inactive blocks, the metal layer comprising titanium nitride.

10. The structure of claim 1 wherein the first ohmic contact is a source terminal of the device structure, and the one or more first inactive blocks are coupled to the source terminal.

11. The structure of claim 10 wherein the source terminal and the one or more first inactive blocks are coupled to ground.

12. The structure of claim 1 wherein the gate has a gate length, and the one or more first inactive blocks have a width that is less than the gate length.

13. A method comprising:
    forming a device structure including a gate and an ohmic contact; and
    forming one or more inactive blocks laterally positioned between the gate and the ohmic contact,
    wherein the one or more inactive blocks comprise gallium nitride with a first concentration of p-type dopant, and the gate comprises gallium nitride with a second concentration of p-type dopant different from the first concentration of p-type dopant.

14. The structure of claim 1 further comprising:
    a field plate coupled to the first ohmic contact,
    wherein the one or more first inactive blocks are coupled to the field plate.

15. The structure of claim 1 wherein the one or more first inactive blocks do not represent terminals of the device structure.

16. The structure of claim 1 wherein the device structure is a high-electron-mobility transistor.

17. The structure of claim 7 further comprising:
a field plate coupled to the first ohmic contact,
wherein the one or more first inactive blocks and the one or more second inactive blocks are coupled to the field plate.

18. The structure of claim 7 wherein the one or more second inactive blocks comprise p-type gallium nitride with the first concentration of p-type dopant.

19. The structure of claim 7 wherein the one or more first inactive blocks and the one or more second inactive blocks are equal in number.

20. The structure of claim 7 wherein the one or more first inactive blocks and the one or more second inactive blocks differ in number.

* * * * *